United States Patent [19]
Suni et al.

[11] Patent Number: 4,958,207
[45] Date of Patent: Sep. 18, 1990

[54] FLOATING DIODE GAIN COMPRESSION

[75] Inventors: Paul P. Suni, San Mateo; David D. Wen, Santa Clara, both of Calif.

[73] Assignee: Loral Fairchild Corporation, Syosset, N.Y.

[21] Appl. No.: 324,923

[22] Filed: Mar. 17, 1989

[51] Int. Cl.⁵ .................... H01L 29/78; H01L 27/14; H01L 31/00; G11C 19/28
[52] U.S. Cl. .................... 357/24; 357/30; 377/58
[58] Field of Search .............. 357/24, 30; 377/57–63

[56] References Cited

U.S. PATENT DOCUMENTS

| | | | |
|---|---|---|---|
| 3,403,284 | 9/1968 | Buck et al. . | |
| 3,465,159 | 9/1969 | Stern . | |
| 3,845,295 | 10/1974 | Williams et al. | 357/24 |
| 3,896,485 | 7/1975 | Early | 357/24 |
| 3,916,429 | 10/1975 | Kostelec . | |
| 3,931,465 | 1/1976 | Levine | 357/24 |
| 3,932,775 | 1/1976 | Kosonocky | 357/24 |
| 3,996,600 | 12/1976 | Patrin | 357/24 |
| 4,041,520 | 8/1977 | Tchon | 357/24 |
| 4,092,549 | 5/1978 | Prince | 377/60 |
| 4,174,528 | 11/1979 | White . | |
| 4,206,371 | 6/1980 | Weimer . | |
| 4,277,694 | 7/1981 | Jensen | 377/60 |
| 4,322,753 | 3/1982 | Ishihara | 357/24 |
| 4,377,755 | 3/1983 | Jensen | 377/63 |
| 4,450,484 | 5/1984 | Terakawa et al. . | |
| 4,473,836 | 9/1984 | Chamberlain . | |
| 4,488,165 | 12/1984 | Levine . | |
| 4,499,590 | 2/1985 | Bluzer | 377/61 |
| 4,590,505 | 5/1986 | Bluzer . | |
| 4,620,214 | 10/1986 | Margalit et al. . | |
| 4,636,980 | 1/1987 | Bluzer . | |
| 4,651,180 | 3/1987 | Nishizawa et al. . | |
| 4,656,494 | 4/1987 | Kobayashi et al. . | |
| 4,694,318 | 9/1987 | Capasso et al. . | |

FOREIGN PATENT DOCUMENTS

| | | | |
|---|---|---|---|
| 1173542 | 8/1984 | Canada | 345/1 |

OTHER PUBLICATIONS

Chamberlin & Lee, "A Novel Wide Dynamic Range Silicon Photodetector and Linear Imaging Array", *IEEE Trans. Elec. Dev.*, vol. Ed-31, No. 2, Feb. 1984, pp. 175–182.

Meindl, "Microelectronic Circuit Elements", *Microelectronics: A Scientific American Book*, pp. 22–23, Piel et al., eds., W. H. Freeman & Co., San Francisco, CA, 1977.

*Primary Examiner*—Gene M. Munson
*Attorney, Agent, or Firm*—Townsend and Townsend

[57] ABSTRACT

A gain compression method and apparatus which is especially suitable for charge coupled devices is disclosed. A mobile charge packet generation area is provided with an adjacent overflow barrier. The overflow barrier is adjacent an N+ diffusion region which provides parasitic capacitance to the overflow barrier. The diffusion region adjusts the potential of the overflow barrier as greater amounts of charge overflow the barrier.

15 Claims, 3 Drawing Sheets

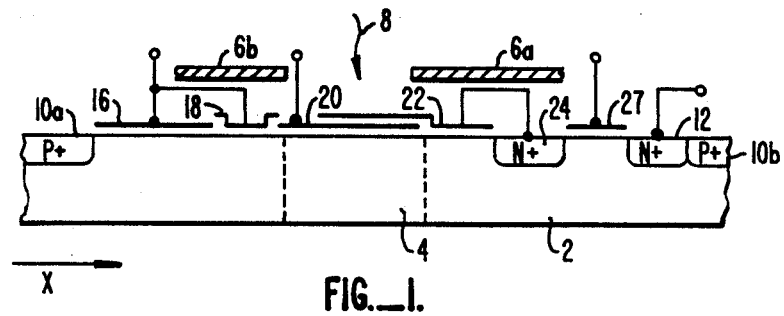
FIG._1.
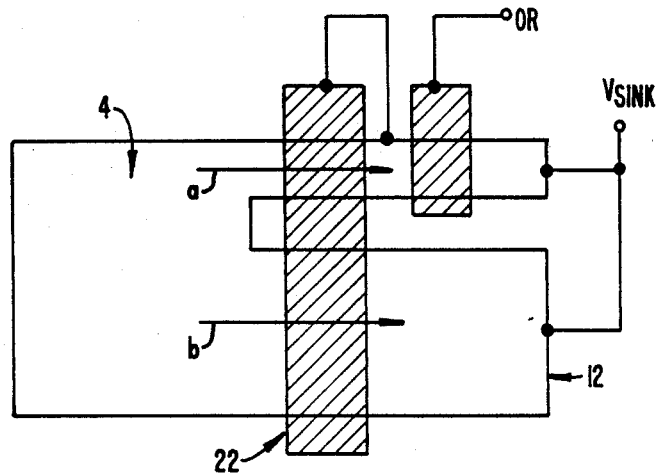
FIG._3.
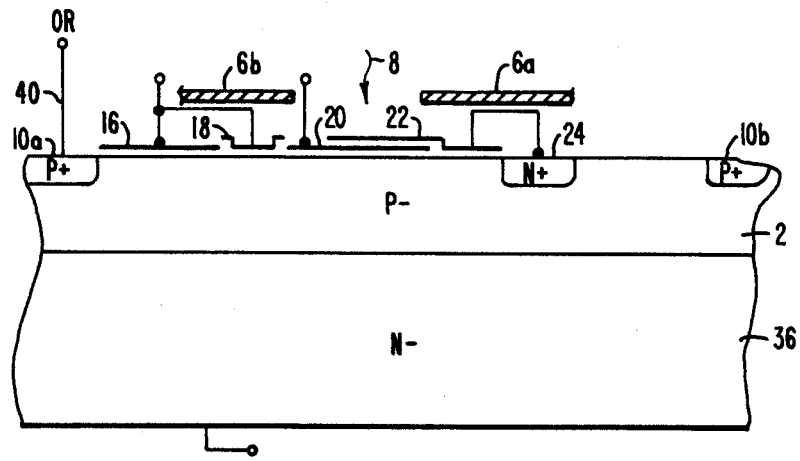
FIG._4.

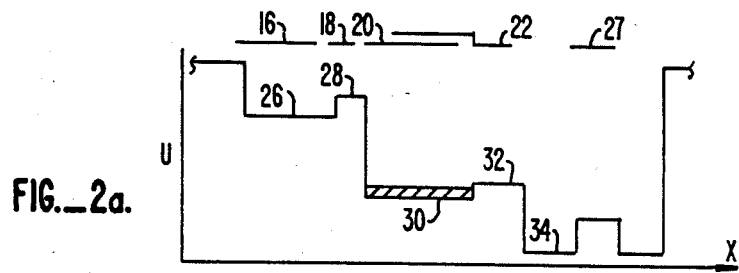
FIG._2a.
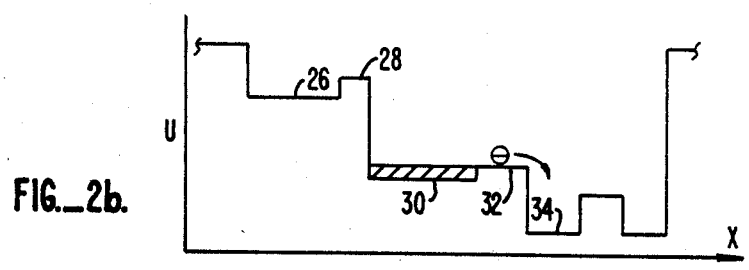
FIG._2b.
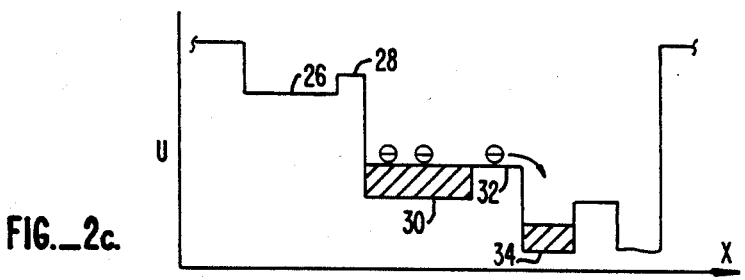
FIG._2c.
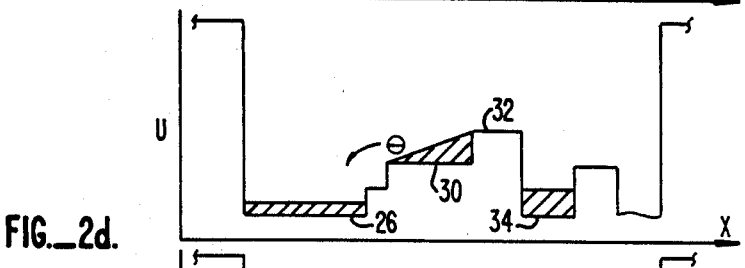
FIG._2d.
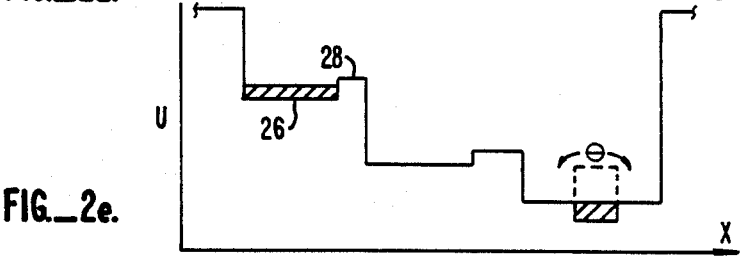
FIG._2e.

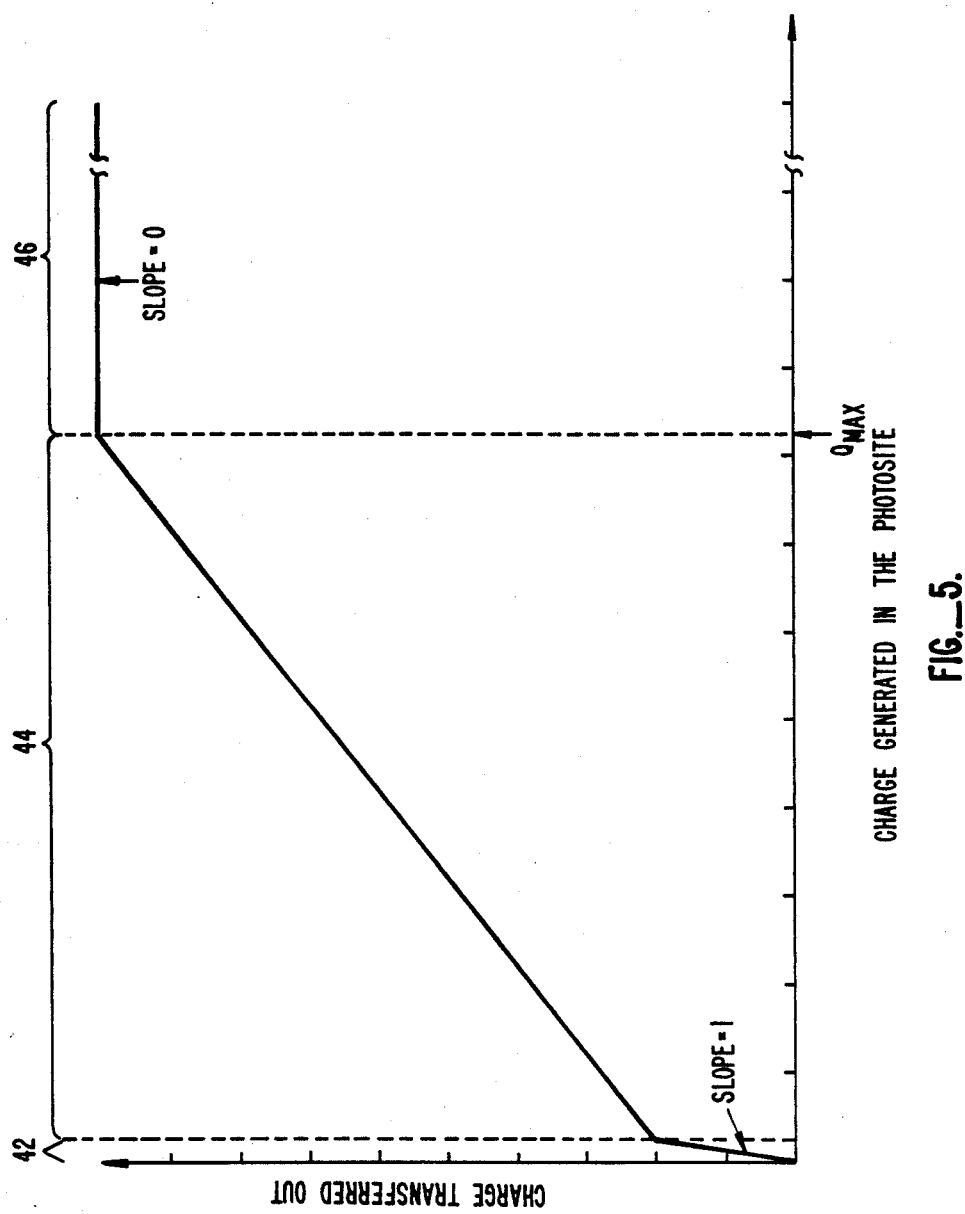

FLOATING DIODE GAIN COMPRESSION

BACKGROUND OF THE INVENTION

Field of the Invention

The present invention relates to the field of semiconductor devices. More particularly, the present invention provides a gain compression method and apparatus which is particularly useful in photodetector devices and, especially, charge coupled devices.

CROSS REFERENCE TO RELATED APPLICATIONS

This application is related to applications having Ser. Nos. 07/324,925 and 07/183,111, entitled "Gain Compression Photodetector Array" and "High Dynamic Range CCD Detector", respectively. Said related applications are assigned to or under an obligation of assignment to the assignee of this invention and are incorporated herein by reference for all purposes.

DESCRIPTION OF RELATED ART

It is well known in the art of semiconductor devices that MOS devices without a source region may be useful in performing certain electrical functions. In general, these devices have been termed charge transfer devices (CTD's) and charge injection devices (CID's). Two types of charge transfer devices are bucket brigade devices and charge-coupled devices (CCD's).

In a charge-coupled device, mobile charge packets (electrons or holes) are introduced into a silicon substrate such as a p— or an n+ substrate. The charge packets may be introduced electrically, or with photon bombardment, such as would be the case in a charge-coupled imager (CCI). After an integrated time, the mobile charge packets are moved along the surface of the substrate by applying clocked voltages to electrodes located on the surface of the substrate. The mobile charge packets can eventually be used in, for example, linear or area imaging. Charge-coupled devices are described in Scientific American, "Microelectronics" pgs 22 and 23 (1977).

Problems arise in charge-coupled devices when substantial amounts of charge accumulate in a small region of the substrate. When substantial amounts of charge accumulate it is possible that a collection region has insufficient capacity to accommodate the number of carriers which are generated, i.e., the collection region becomes saturated. Saturation occurs if, for example, an extremely high-intensity light was directed at a charge-coupled imager.

To overcome the above described problem, a variety of solutions have been proposed. For example, in U.S. Pat. No. 3,916,429 various values of reverse bias are applied to gating diodes to make the depletion depth large. The problem with this solution is that the amount of gain compression that can be obtained is limited because impractically large potential differences must be applied to achieve effective gain control. Further, for some wavelengths of light (e.g., blue light), the technique is ineffective because charge is collected near the surface in any event. Further, a multi-sloped gain curve cannot easily be obtained.

Other more sophisticated versions of the above solution have also been proposed. For example, Bluzer, U.S. Pat. No. 4,636,980, discloses a device in which gain is varied exponentially in real time using a programmable gain control. Again, gain control is obtained via an applied bias voltage.

Weimer, U.S. Pat. No. 4,206,371 discloses a readout system for a CCD. An electrode is placed over, for example, a p— — region and a p— — — region. A p— region serves as a barrier between the p— — region and the p— — — region. Charge is moved within the substrate by applying varying voltages to the electrode. When the electrode potential is high, charge is retained in the p— — region. As the electrode potential is lowered, charge is generally moved from the p— — area over the barrier region to the p— — — region. Eventually, essentially all of the charge is removed from the p— — region to the p— — — region. No method or apparatus of providing gain in the device is shown or suggested.

SUMMARY OF THE INVENTION

A gain compression method and apparatus for semiconductor devices is disclosed. A charge generation area is provided with an overflow barrier, the overflow barrier being adjacent a floating diffusion area. The floating diffusion area is connected to the overflow barrier such that when charge (or holes) fill the charge generation well and overflow the overflow barrier, the potential of the barrier is adjusted to allow the accumulation of more electrons or holes in the generation area. In a preferred embodiment, the overflow barrier potential is adjusted by an N+ diffusion diode which provides parasitic capacitance to the overflow barrier.

In a second embodiment, the overflow of electron or holes from the overflow barrier is divided into two components; a first component adjusting the overflow barrier potential and a second component which is disposed of in a sink.

A reset method and apparatus is also disclosed. An MOS transistor is utilized in one embodiment. A pulse is sent to an electrode which acts as the gate of the MOS transistor with the N+ diffusion area acting as the source. An alternative reset apparatus utilizes a bipolar vertical reset structure.

DESCRIPTION OF THE DRAWINGS

FIG. 1 shows one embodiment of the semiconductor structure described herein, in cross section.

FIGS. 2a-2e show the potential of the regions of the semiconductor device shown in FIG. 1 as the device is filled with charge.

FIG. 3 shows an alternative embodiment of the device shown in FIG. 1 in top view.

FIG. 4 shows an alternative embodiment of the device shown in FIG. 1 utilizing a bipolar reset structure.

FIG. 5 shows the amount of charge transferred and of the device versus the amount of charge generated in the photosite.

DETAILED DESCRIPTION OF THE PREFERRED EMBODIMENTS

FIG. 1 illustrates a first embodiment of the invention described herein. The device is generally constructed on a substrate 2. Substrate 2 is preferably a silicon material lightly doped with a p— dopant. Other materials and dopants will be readily apparent to those of skill in the art. For example the substrate might be lightly doped with an N type material.

Within the substrate a photosite is defined by a light shield, indicated in FIG. 1 by 6a and 6b. Light shield 6a and 6b may be made of any material which is opaque to the wavelength of interest and may, e.g., be a metallization layer. Light, indicated by arrow 8, enters the photosite by passing between light shields 6a and 6b.

Within a substrate, p+ regions 10a and 10b are also provided. The p+ regions generally serve as potential barriers which prevent the migration of electrons from the area indicated in FIG. 1 to adjacent photodetection sites and, conversely, prevent the migration of charge from adjacent sites into the photodetector site indicated in FIG. 1. N+ areas 12 and 24 are also provided. N+ area 12 serves as a sink region for the withdrawal of charge introduced which is greatly in excess of the charge handling capability of the device. N+ area 24 serves as a floating diffusion area, the function of which is more fully described below.

A series of electrodes are formed above the substrate. The electrodes are preferably metallic electrodes, but those of skill in the art would immediately recognize that heavily doped poly or mono silicon electrodes could also be utilized. Electrode 16 defines a shift register in the substrate. Electrode 18 defines a potential barrier in the substrate between the transfer register and the photosite. Electrode 20 is used to define the potential in the photosite. Electrode 22 is used to define the potential of an overflow barrier adjacent the photosite.

An N+ diffusion diode 24 is attached to the overflow electrode. This N+ diffusion diode provides voltage feedback that changes the potential of the overflow barrier adjacent the photosite. By changing this overflow barrier potential more charge may be held in the photogate/photosite. As a consequence, large amounts of charge may be generated in the photodetector while only a small portion of the large signal is output via the transfer electrodes combination 16 and 18, Electrode 27 serves as a reset gate.

FIGS. 2a to 2e illustrate the operation of the invention. In general the channel potential is plotted in FIGS. 2a to 2e as a function of the x coordinate in the device. FIG. 2a illustrates the device when only a small amount of charge has been generated in the photosite. Electrodes 16 and 18 define the shift register 26 and a potential barrier 28, both of which have relatively high potential (which could be equal in some embodiments). Electrode 20 defines the potential in the photosite, as illustrated in FIG. 2a by potential level 30. As shown by the cross hatched lines, charge has not yet accumulated in an amount sufficient to overflow barrier 32, which is formed by electrode 22.

As shown in FIG. 2b, when a larger amount of charge is generated in the photosite charge begins to overflow into the floating diffusion area 34. As illustrated in FIG. 2c, as charge flows into the floating diffusion area, the potential of barrier 32 begins to rise, thereby accommodating more charge in the photosite 30 because of the N+ diffusion area attached to the overflow gate electrode.

FIG. 2d illustrates the potential profile in the device when charge is to be transferred and into the shift register. The potential of barrier 18 and shift register 26 is lowered significantly below the potential of the photosite potential, permitting charge to flow from the photosite into the shift register. Charge is transferred out of the shift register for use in, for example, a video display by means well known to those of skill in the art.

Thereafter, as illustrated in FIG. 2e the floating diffusion area is reset by pulsing a signal from an OR gate (not shown) which is attached to electrode 27. Electrode 27 acts as the gate of an MOS transistor with source 24 and drain 12.

An alternative embodiment to the above described gain control structure is schematically shown in FIG. 3, in which a portion of the device shown in FIG. 1 is illustrated in top view. The device includes a photosensitive area 4, an overflow barrier electrode 22 and a N+ drain region 12. The photo generated current flowing over the barrier is divided into 2 components (illustrated by arrows "a" and "b").

The first component, a, flows directly into the sink. Only the second component, b, is stored and acts as feedback to increase the potential of the overflow barrier. As a consequence, the dynamic range of the device is increased by a factor of approximately a/b.

A third embodiment of the device is shown in FIG. 4, which again illustrates the device in cross section, similar to FIG. 1. In the embodiment shown in FIG. 4 the surface area occupied by the device has been greatly reduced because a vertical reset structure is utilized. Specifically, the MOS structure (which serves in FIG. 1 as a reset structure) has been replaced by a vertical bipolar transistor which is reverse biased during integration. More specifically, p− layer 2 is placed on an N− substrate 36. N− layer 36 is provided with a reverse bias connection 38, while p+ region 10a is connected to an OR gate by a connection 40. The device then functions as follows. A pulse is sent to reset connection 40. The reset device then acts as a diode, adjusting the potential profile of the device such that charge is disposed of in a sink (formed by N− region 36).

FIG. 5 plots charge transferred out of the device as a function of charge generated in the photosite. As shown, the device has a linear region 42, a high gain region 44, and a saturated region 46. In the linear region the device exhibits an extremely high signal to noise ratio and essentially 100% of the signal charge is transferred into the shift register. In the higher gain region 44 essentially 100% of a small amount of charge plus a small portion of a large signal charge is transferred out of the shift register. Above some value, QMAX, the photosite becomes saturated and all excess charge is transferred into the sink.

It is to be understood that the above description is intended to be illustrative and not restrictive. Many embodiments will be apparent to those of skill in the art upon reviewing the above description. For example, while certain of the above embodiments have been illustrated by way of various P and N type doped materials it is generally known in the art that complimentary materials of opposite type may be substituted and biasing potentials may be inverted as well. Thus, in the above description, P and N type materials may be exchanged, N-expitaxial materials may be replaced by P− epitaxial materials, and P+ materials may be replaced by N+ materials. Further, materials other than silicon may readily be used. By way of further example, the above described gain compression technique could be combined with previously known gain detection techniques. In addition, the invention could be applied to Charge Transfer Devices, Charge Injection Devices, metal insulator semiconductor transistor arrays, junction charge coupled devices, Schottky barrier devices, and the like. The scope of the invention should, therefore, be determined not with reference to the above description, but should instead be determined with referenced to the appended claims, along with the full scope of equivalents to which such claims are entitled.

What is claimed is:

1. Imaging apparatus in a semiconductor substrate comprising:
   a mobile charge generation area in said substrate;
   an overflow barrier in said substrate adjacent said charge generation area;
   an overflow collection area in said substrate adjacent said overflow barrier, said overflow collection area retaining said overflowed charge and connected to said overflow barrier so that when mobile charge carriers enter the collection area said overflow barrier is adjusted to permit less mobile charge from overflowing said barrier;
   a shift register for receiving charge from said mobile charge generation area; and
   reset apparatus for draining charge away from said overflow collection area.

2. Apparatus as recited in claim 1 wherein said overflow collection area is an N+ diffusion diode providing voltage feedback to said overflow barrier.

3. Apparatus as recited in claim 1 further comprising means for transferring charge from said charge generation area.

4. Imaging apparatus in a semiconductor substrate comprising:
   a mobile charge generation area in said substrate;
   an overflow barrier in said substrate adjacent said charge generation area;
   an overflow collection area in said substrate adjacent said overflow barrier, said overflow collection area retaining said overflowed charge and connected to said overflow barrier so that when mobile charge carriers enter the collection area said overflow barrier is adjusted to permit less mobile charge from overflowing said barrier; and
   reset apparatus comprising a field effect transistor, said field effect transistor having said overflow collection area acting as a source region.

5. Imaging apparatus in a semiconductor substrate comprising:
   a mobile charge generation area in said substrate;
   an overflow barrier in said substrate adjacent said charge generation area;
   an overflow collection area in said substrate adjacent said overflow barrier, said overflow collection area retaining said overflowed charge and connected to said overflow barrier so that when mobile charge carriers enter the collection area said overflow barrier is adjusted to permit less mobile charge from overflowing said barrier; and
   reset apparatus, said reset apparatus comprising a bipolar transistor, a portion of said substrate forming a base of said bipolar transistor.

6. Imaging apparatus in a semiconductor substrate comprising:
   a mobile charge generation area in said substrate;
   an overflow barrier in said substrate adjacent said charge generation area;
   an overflow collection area in said substrate adjacent said overflow barrier, said overflow collection area retaining said overflowed charge and connected to said overflow barrier so that when mobile charge carriers enter the collection area said overflow barrier is adjusted to permit less mobile charge from overflowing said barrier; and
   wherein a fraction of charge overflowing said overflow barrier is diverted to a sink.

7. Apparatus as recited in claim 6 wherein said fraction is between about 10 and 90 percent.

8. Apparatus as recited in claim 1 further comprising means for producing an image based on an amount of charge generated in said generation area.

9. A method for determining an amount of charge generated in a generation area in a semiconductor substrate, an overflow barrier provided in said substrate adjacent said generation area, comprising:
   collecting charge overflowing said overflow barrier in a diffusion area in said substrate;
   adjusting a potential of said barrier based on an amount of charge collected in said diffusion area so as to permit a greater amount of charge to accumulate in said generation area;
   collecting charge from said generation area; and
   disposing of charge from said diffusion area.

10. A method for determining an amount of charge generated in a generation area in a semiconductor substrate, an overflow barrier provided in said substrate adjacent said generation area, comprising:
    collecting charge overflowing said overflow barrier in a diffusion area in said substrate;
    adjusting a potential of said barrier based on an amount of charge collected in said diffusion area so as to permit a greater amount of charge to accumulate in said generation area; and
    collecting a portion of charge overflowing said overflow barrier in a sink.

11. The method as recited in claim 9 further comprising the step of resetting said overflow barrier.

12. A method for determining an amount of charge generated in a generation area in a semiconductor substrate, an overflow barrier provided in said substrate adjacent said generation area, comprising:
    collecting charge overflowing said overflow barrier in a diffusion area in said substrate;
    adjusting a potential of said barrier based on an amount of charge collected in said diffusion area so as to permit a greater amount of charge to accumulate in said generation area; and
    resetting said overflow barrier, said step of resetting comprising the step of activating a gate electrode of a field effect transistor, said field effect transistor having said a diffusion area as a source region.

13. A method for determining an amount of charge generated in a generation area in a semiconductor substrate, an overflow barrier provided in said substrate adjacent said generation area, comprising:
    collecting charge overflowing said overflow barrier in a diffusion area in said substrate;
    adjusting a potential of said barrier based on an amount of charge collected in said diffusion area so as to permit a greater amount of charge to accumulate in said generation area; and
    resetting said overflow barrier, said step of resetting further comprising the step of sending a pulse through a bipolar transistor, a portion of said substrate comprising a base of said bipolar transistor.

14. A method for determining an amount of charge generated in a generation area in a semiconductor substrate, an overflow barrier provided in said substrate adjacent said generation area, comprising:
    collecting charge overflowing said overflow barrier in a diffusion area in said substrate;
    adjusting a potential of said barrier based on an amount of charge collected in said diffusion area so as to permit a greater amount of charge to accumulate in said generation area, said step of adjusting further comprising the step of providing parasitic capacitance to the overflow barrier.

15. A device in a semiconductor substrate for producing an image comprising:

a mobile charge generation area for generating and collecting mobile charge packets from incoming light;

an overflow barrier adjacent said mobile charge generation area;

an N+ diffusion area adjacent said overflow barrier and connected to the overflow barrier, said N+ diffusion region providing parasitic capacitance to the overflow barrier;

a field effect transistor for resetting said N+ diffusion area, said field effect transistor having said N+ diffusion area as a source region.

* * * * *